US008309295B2

(12) United States Patent
Sasaki et al.

(10) Patent No.: US 8,309,295 B2
(45) Date of Patent: Nov. 13, 2012

(54) PHOTOSENSITIVE INSULATING RESIN COMPOSITION, HARDENING PRODUCT THEREOF, AND CIRCUIT BOARD EQUIPPED THEREWITH

(75) Inventors: Hirofumi Sasaki, Tokyo (JP); Atsushi Ito, Tokyo (JP); Takashi Nishioka, Tokyo (JP); Hirofumi Goto, Tokyo (JP)

(73) Assignee: JSR Corporation, Tokyo (JP)

( * ) Notice: Subject to any disclaimer, the term of this patent is extended or adjusted under 35 U.S.C. 154(b) by 303 days.

(21) Appl. No.: 12/438,133

(22) PCT Filed: Jul. 30, 2007

(86) PCT No.: PCT/JP2007/064917
§ 371 (c)(1),
(2), (4) Date: Jul. 6, 2010

(87) PCT Pub. No.: WO2008/026406
PCT Pub. Date: Mar. 6, 2008

(65) Prior Publication Data
US 2010/0276186 A1    Nov. 4, 2010

(30) Foreign Application Priority Data

Aug. 29, 2006  (JP) .................................. 2006-232670
Aug. 29, 2006  (JP) .................................. 2006-232671

(51) Int. Cl.
*H05K 1/00*     (2006.01)
*G03F 7/004*    (2006.01)
(52) U.S. Cl. .................. 430/270.1; 430/280.1; 174/258
(58) Field of Classification Search ............... 430/270.1, 430/280.1; 174/258
See application file for complete search history.

(56) References Cited

U.S. PATENT DOCUMENTS 7,015,256 B2 *   3/2006   Ito et al. ........................ 522/81

FOREIGN PATENT DOCUMENTS

| JP | 54-145794 | 11/1979 |
|----|-----------|---------|
| JP | 03-186847 | 8/1991 |
| JP | 05-5996 | 1/1993 |
| JP | 08-50354 | 2/1996 |
| JP | 2000-98601 | 4/2000 |
| JP | 2006-154434 | 6/2006 |
| JP | 2007-57595 | 3/2007 |
| WO | WO 2006/046687 | 5/2006 |

OTHER PUBLICATIONS

Japanese Office Action for corresponding JP Application No. 2008-531998, Aug. 21, 2012.

* cited by examiner

*Primary Examiner* — Robert D. Harlan
(74) *Attorney, Agent, or Firm* — Ditthavong Mori & Steiner, P.C.

(57) ABSTRACT

A photosensitive insulating resin composition capable of forming an interlayer insulating film, or planarized film, or surface protective film, or insulating film for high-density mount substrate excelling in properties, such as resolution, adherence, thermal impact, electrical insulation, patterning performance and elongation; a hardening product thereof; and a circuit board equipped with the hardening product. There is provided a positive photosensitive insulating resin composition comprising an alkali-soluble resin; a compound having a quinonediazido group; and crosslinked resin particles of a particulate copolymer whose 20 to 90 mol % constituent is derived from a hydroxylated and/or carboxylated monomer.

15 Claims, 2 Drawing Sheets

F I G. 4
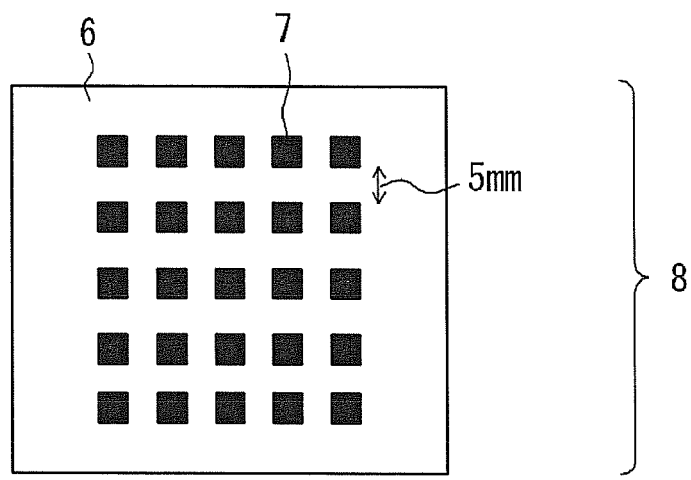
F I G. 5
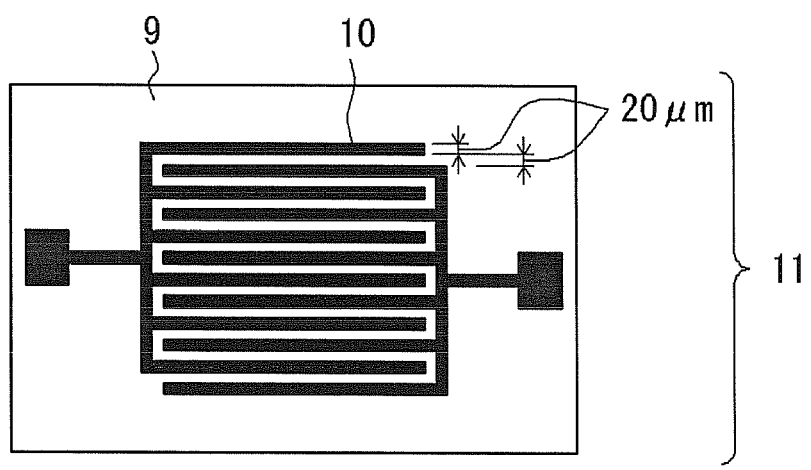

PHOTOSENSITIVE INSULATING RESIN COMPOSITION, HARDENING PRODUCT THEREOF, AND CIRCUIT BOARD EQUIPPED THEREWITH

FIELD OF THE INVENTION

The present invention relates to a photosensitive insulating resin composition which is used for forming an interlayer insulation film such as a passivation film, a planarized film, a surface-protecting film such as an overcoat film and a passivation film, an insulating film for high-density mounting board and the like for semiconductor elements or the like, an insulating hardened material formed by hardening this composition, and a circuit board equipped therewith. In more detail, the present invention relates to a hardened material which is excellent in resolution in the case of forming a permanent resist and that has excellent properties such as adhesion, thermal shock resistance, electrical insulation property, patterning performance and elongation, a positive- and negative-type photosensitive insulating resin compositions that can obtain such a hardened material, and a circuit board equipped with the hardened material.

BACKGROUND ART

A polyimide resin excellent in heat resistance, mechanical characteristics and the like has been widely used for an interlayer insulation film, a surface-protecting film and the like for semiconductor elements in electronic instruments.

Additionally, a photosensitive polyimide resin to which photosensitivity is given for improvement of productivity, improvement of film forming accuracy and the like has been variously examined. For example, a negative type in which a photocrosslinking group is introduced into a polyimide precursor by ester bonding or ion bonding has been put into practice. Moreover, as a positive type, a composition of a polyimide precursor and an ortho-quinone diazide compound is described (See Patent Documents 1 and 2, and the like). However, the negative type has a problem in resolution and film formation, while the positive type has a problem in heat resistance, electrical insulation property, adhesion to a board and the like.

Other many patent documents have been filed, but characteristics required by higher integration, thinning and the like of the semiconductor element are not sufficiently satisfied. Further, there are problems of film thickness reduction (volume contraction rate) after hardening, requiring multistage baking for hardening, atmospheric control and the like so that the film can not be used easily in industrial applications is pointed out.

On the other hand, various photosensitive polyimide resins with photosensitivity imparted have been proposed in order to improve film forming accuracy according to higher integration of the semiconductor element. For example, Patent Documents 3 and 4 disclose a composition containing a photosensitive polyimide resin in which a photocrosslinking group is introduced into a polyimide precursor by ion bonding and a composition containing a photosensitive polyimide resin in which a photocrosslinking group is introduced into a polyimide precursor by ester bonding, respectively.

However, in these compositions, there is a defect that a closed loop process is required for imidization and since it is a solvent developing, resolution is not sufficient.

Patent Document 5 discloses a negative-type photosensitive composition in which a multi-functional acrylic compound is added to an aromatic polyimide precursor, but a problem similar to the above is pointed out.

[Patent Document 1]
Japanese Unexamined Patent Application Publication No. JP-A H05-5996
[Patent Document 2]
Japanese Unexamined Patent Application Publication No. JP-A 2000-98601
[Patent Document 3]
Japanese Unexamined Patent Application Publication No. JP-A S54-145794
[Patent Document 4]
Japanese Unexamined Patent Application Publication No. JP-A H03-186847
[Patent Document 5]
Japanese Unexamined Patent Application Publication No. JP-A H08-50354

DISCLOSURE OF THE INVENTION

Problems that the Invention is to Solve

The present invention has an object to provide a positive- and negative-type photosensitive insulating resin compositions on which an interlayer insulation film, planarized film, surface-protecting film and insulating film for high-density mounting board excellent in characteristics such as resolution, adhesion, thermal shock resistance, electrical insulation property, patterning performance and elongation can be formed solving the problems with the above prior arts. Moreover, the present invention has an object to provide a hardened material (insulating film) obtained by hardening the photosensitive insulating resin compositions and a circuit board equipped with the hardened material.

Means for Solving the Problems

The inventors have proceeded with keen examination in order to solve the above-mentioned problems and have found out a positive-type photosensitive insulating resin composition and a negative-type photosensitive insulating resin composition having excellent characteristics.

The present invention is as follows.
[1] A positive-type photosensitive insulation resin composition characterized by comprising an alkali-soluble resin, a compound having a quinone-diazide group, and a crosslinked resin particle consisting of a particulate copolymer containing a constituent derived from a monomer having a hydroxyl group and/or a carboxyl group in an amount of 20% to 90% by mol.
[2] The positive-type photosensitive insulation resin composition according to [1] above, wherein the alkali-soluble resin is an alkali-soluble resin having a phenolic hydroxyl group.
[3] The positive-type photosensitive insulation resin composition according to [1] above, further comprising a crosslinking agent.
[4] The positive-type photosensitive insulation resin composition according to [1] above, further comprising a compound having two or more oxirane rings in its molecule.
[5] The positive-type photosensitive insulation resin composition according to [1] above, wherein the monomer having a hydroxyl group and/or a carboxyl group is at least one compound selected from the group consisting of hydroxyethyl (meth)acrylate, hydroxypropyl(meth)acrylate, hydroxybutyl (meth)acrylate, (meth)acrylic acid, itaconic acid, β-(meth)

acryloxyethyl succinate, β-(meth)acryloxyethyl maleate, β-(meth)acryloxyethyl phthalate and β-(meth)acryloxyethyl hexahydrophthalate.

[6] The positive-type photosensitive insulation resin composition according to [1] above, wherein the crosslinked resin particle is consisting of a copolymer of the monomer having a hydroxyl group and/or a carboxyl group and a crosslinkable monomer having two or more polymerizable unsaturated groups.

[7] The positive-type photosensitive insulation resin composition according to [1] above, wherein average diameter of the crosslinked resin particle is in the range from 50 to 120 nm.

[8] A hardened material characterized by being formed by hardening the positive-type photosensitive insulation resin composition according to 1 above.

[9] A circuit board characterized by comprising the hardened material according to [8] above as an interlayer insulation film or a planarized film.

[10] A negative-type photosensitive insulation resin composition characterized by comprising an alkali-soluble resin, a crosslinking agent, a photosensitive acid generator, and a crosslinked resin particle consisting of a particulate copolymer containing a constituent derived from a monomer having a hydroxyl group and/or a carboxyl group in an amount of 20% to 90% by mol.

[11] The negative-type photosensitive insulation resin composition according to [10] above, wherein the alkali-soluble resin is an alkali-soluble resin having a phenolic hydroxyl group.

[12] The negative-type photosensitive insulation resin composition according to [10] above, further comprising a compound having two or more oxirane rings in its molecule.

[13] The negative-type photosensitive insulation resin composition according to [10] above, wherein the monomer having a hydroxyl group and/or a carboxyl group is at least one compound selected from the group consisting of hydroxyethyl(meth)acrylate, hydroxypropyl(meth)acrylate, hydroxybutyl(meth)acrylate, (meth)acrylic acid, itaconic acid, β-(meth)acryloxyethyl succinate, β-(meth)acryloxyethyl maleate, β-(meth)acryloxyethyl phthalate and β-(meth)acryloxyethyl hexahydrophthalate.

[14] The negative-type photosensitive insulation resin composition according to [10] above, wherein the crosslinked resin particle is consisting of a copolymer of the monomer having a hydroxyl group and/or a carboxyl group and a crosslinkable monomer having two or more polymerizable unsaturated groups.

[15] The negative-type photosensitive insulation resin composition according to [10] above, wherein average diameter of the crosslinked resin particle is in the range from 50 to 120 nm.

[16] A hardened material characterized by being formed by hardening the negative-type photosensitive insulation resin composition according to [10] above.

[17] A circuit board characterized by comprising the hardened material according to [16] above as an interlayer insulation film or a planarized film.

Effect of the Invention

The photosensitive insulating resin composition of the present invention is excellent in development performance in pattern formation as well as in elongation and insulation of an insulating film after hardening since the concentration of a crosslinked resin particles in the resin composition can be set high by having specific crosslinked resin particle with excellent dispersion performance contained. And the photosensitive insulating resin composition leads to a hardened material excellent in resolution, adhesion, thermal shock resistance, electrical insulation property, patterning performance, elongation, chemical resistance and the like. Therefore, the resin composition can be suitably used for forming a surface-protecting film such as an overcoat film and a passivation film, an interlayer insulation film such as a passivation film, a planarized film, an insulating film for high-density mounting board and the like in electronic parts including a circuit board and the like.

BRIEF DESCRIPTION OF THE DRAWINGS

FIG. 4 is a schematic diagram for showing the base material for thermal shock resistance evaluation.

FIG. 5 is a schematic diagram for showing a base material for electrical insulation property evaluation.

EXPLANATION OF THE REFERENCE NUMBERS

Figure 1:
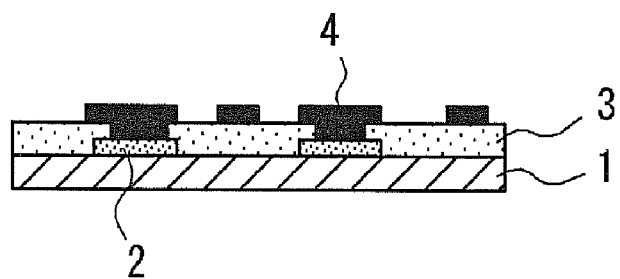
FIG. 1 is a schematic diagram for showing a section of a circuit board.

1: substrate, 2: metal pad, 3: hardened insulating film, 4: metal wiring, 5: hardened insulating film, 6: substrate, 7: copper foil, 8: base material for evaluating thermal shock resistance, 9: substrate, 10: copper foil, 11: base material for evaluating electrical insulation property

DESCRIPTION OF PREFERRED EMBODIMENTS

The embodiment modes of the present invention will be described in greater detail. It is noted that "(meth)acryl" means acryl and methacryl in this specification.

[1] Positive-Type Photosensitive Insulation Resin Composition

The positive-type photosensitive insulation resin composition of the present invention comprises an alkali-soluble resin, a compound having a quinone-diazide group, and a crosslinked resin particle consisting of a particulate copolymer containing a constituent derived from a monomer having a hydroxyl group and/or a carboxyl group in an amount of 20% to 90% by mol.

[1-1] Alkali-Soluble Resin

The alkali-soluble resin in the positive-type photosensitive insulation resin composition of the present invention (hereinafter also referred to as "alkali-soluble resin (A)") includes an alkali-soluble resin having a phenolic hydroxyl group (hereinafter also referred to as "phenol resin"), an alkali-soluble resin having a carboxyl group, and the like. Among them, the phenol resin is suitably used.

a hydroxystyrene-styrene copolymer, a copolymer from hydroxystyrene, styrene and a derivative of (meth)acrylic acid, As the above-mentioned phenol resin, a novolak resin, polyhydroxystyrene, a polyhydroxystyrene copolymer, a phenol-xylylene glycol condensation resin, a cresol-xylylene glycol condensation resin, a phenol-dicyclopentadiene condensation resin and the like may be used. Among these, a novolak resin and a polyhydroxystyrene copolymer are preferably used. And a copolymer of vinyl benzoic acid and styrene, a copolymer of p-hydroxystyrene and styrene, polyhydroxystyrene, a copolymer of p-hydroxystyrene, styrene and (meth)acrylic acid ester, and a cresol novolak resin of m-cresol and p-cresol, and the like are particularly used.

The novolak resin can be obtained by, for example, condensation of a phenol compound with an aldehyde in the presence of a catalyst.

Examples of the above-mentioned phenol compound include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, β-naphthol and the like.

Examples of the aldehyde include formaldehyde, paraformaldehyde, acetaldehyde, benzaldehyde and the like.

Specific examples of the novolak resin include a phenol-formaldehyde condensation novolak resin, a cresol-formaldehyde condensation novolak resin, a phenol-naphthol-formaldehyde condensation novolak resin and the like.

The alkali-soluble resin (A) may be used singly or in combination of two or more types thereof.

Additionally, the above-mentioned alkali-soluble resin (A) may contain a low molecular weight phenolic compound as one component.

Examples of the low molecular weight phenolic compound include 4,4'-dihydroxydiphenylmethane, 4,4'-dihydroxydiphenyl ether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, 1,1,2,2-tetra(4-hydroxyphenyl) ethane and the like. The low molecular weight phenolic compound may be used singly or in combination of two or more types thereof.

The content of the low molecular weight phenolic compound in the alkali-soluble resin (A) is preferably 40% or less by weight and more preferably in the range from 1% to 30% by weight based on 100% by weight of the alkali-soluble resin (A).

The weight-average molecular weight of the alkali-soluble resin (A) according to the present invention is preferably 2,000 or more and more preferably in the range from 2,000 to about 50,000 from the viewpoints of resolution, thermal shock resistance, heat resistance and elongation of the resultant insulating film.

Additionally, the content of the alkali-soluble resin (A) in the positive-type photosensitive insulating resin composition of the present invention is preferably in the range from 20% to 90% by weight, and more preferably from 30% to 80% by weight based on 100% by weight of the total solid portion excluding a solvent. If the content of the alkali-soluble resin (A) is in the range from 20% to 90% by weight, a film formed using the positive-type photosensitive insulating resin composition has a sufficient development performance by an alkali aqueous solution and excellent in characteristics as a hardened film, being preferable.

[1-2] Compound Having Quinone-Diazide Group

The compound having a quinone-diazide group in the positive-type photosensitive insulating resin composition of the present invention (hereinafter also referred to as "quinone-diazide compound (B)") is an ester compound of a compound having at least one phenolic hydroxyl group and 1,2-naphthoquinone-diazide-4-sulfonic acid or 1,2-naphthoquinone-diazide-5-sulfonic acid.

The compound having at least one phenolic hydroxyl group is not particularly limited, but a compound with a structure shown below is preferable.

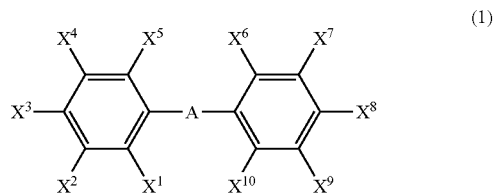

[In the general formula (1), $X^1$ to $X^{10}$ may be the same or different from each other and each of them is a hydrogen atom, an alkyl group with carbon number of 1 to 4, an alkoxy group with carbon number of 1 to 4, or a hydroxyl group. At least one of $X^1$ to $X^5$ is a hydroxyl group. Also, A is a single-bond, O, S, $CH_2$, $C(CH_3)_2$, $C(CF_3)_2$, C=O or $SO_2$.]

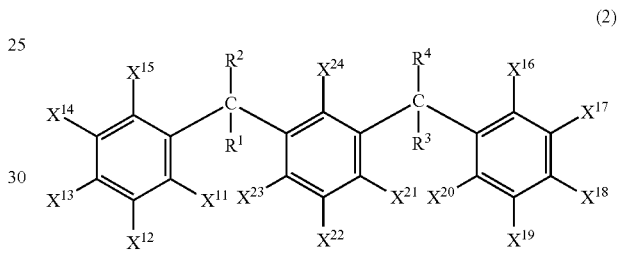

[In the general formula (2), $X^{11}$ to $X^{24}$ may be the same or different from each other and each of them is a hydrogen atom, an alkyl group with carbon number of 1 to 4, an alkoxy group with carbon number of 1 to 4, or a hydroxyl group. At least one of $X^{11}$ to $X^{15}$ is a hydroxyl group. Also, $R^1$ to $R^4$ may be the same or different from each other and each of them is a hydrogen atom or an alkyl group with carbon number of 1 to 4.]

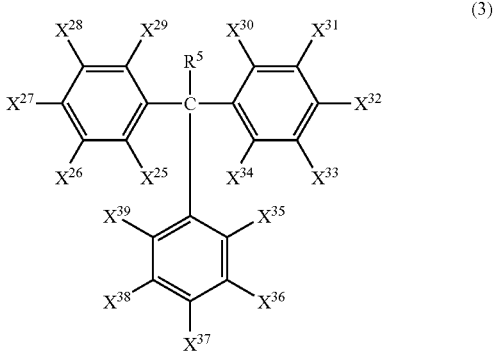

[In the general formula (3), $X^{25}$ to $X^{39}$ may be the same or different from each other and each of them is a hydrogen atom, an alkyl group with carbon number of 1 to 4, an alkoxy group with carbon number of 1 to 4, or a hydroxyl group. At least one of $X^{25}$ to $X^{29}$ and at least one of $X^{30}$ to $X^{34}$ are hydroxyl groups. Also, $R^5$ is a hydrogen atom or an alkyl group with carbon number of 1 to 4.]

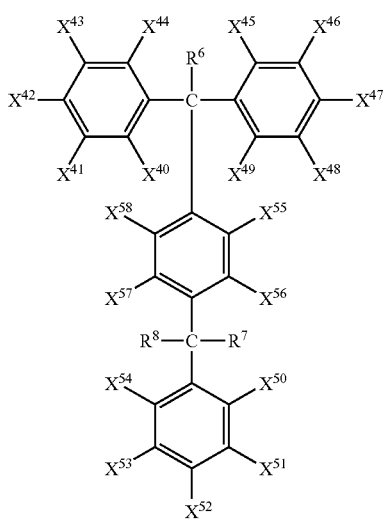

(4)

[In a general formula (4), $X^{40}$ to $X^{58}$ may be the same or different from each other and each of them is a hydrogen atom, alkoxy group or an alkyl group with carbon number of 1 to 4, an alkoxy group with carbon number of 1 to 4, or a hydroxyl group. At least one of $X^{40}$ to $X^{44}$, at least one of $X^{45}$ to $X^{49}$, and at least one of $X^{50}$ to $X^{54}$ are hydroxyl groups. Also, $R^6$ to $R^8$ may be the same or different from each other and each of them is a hydrogen atom or an alkyl group with carbon number of 1 to 4.]

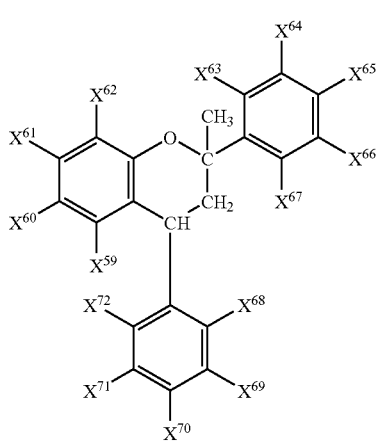

(5)

[In the general formula (5), $X^{59}$ to $X^{72}$ may be the same or different from each other and each of them is a hydrogen atom, an alkyl group with carbon number of 1 to 4, an alkoxy group with carbon number of 1 to 4 or a hydroxyl group. At least one of $X^{59}$ to $X^{62}$ and at least one of $X^{63}$ to $X^{67}$ are hydroxyl groups.]

Specific example of the quinone-diazide compound (B) includes an ester compound of 4,4'-dihydroxydiphenylmethane, 4,4'-dihydroxydiphenyl ether, 2,3,4-trihydroxybenzophenone, 2,3,4,4'-tetrahydroxybenzophenone, 2,3,4,2',4'-pentahydroxybenzophenone, tris(4-hydroxyphenyl)methane, tris(4-hydroxyphenyl)ethane, 1,1-bis(4-hydroxyphenyl)-1-phenylethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene or 1,1-bis(4-hydroxyphenyl)-1-[4-{1-(4-hydroxyphenyl)-1-methylethyl}phenyl]ethane with 1,2-naphthoquinone-diazide-4-sulfonic acid or 1,2-naphthoquinone-diazide-5-sulfonic acid, and the like.

The quinone-diazide compound (B) may be used singly or in combination of two or more types thereof.

Additionally, the compounding amount of the quinone-diazide compound (B) is preferably in the range from 10 to 50 parts by weight and more preferably from 15 to 30 parts by weight based on 100 parts by weight of the alkali-soluble resin (A). If the compounding amount of the quinone-diazide compound (B) is less than 10 parts by weight, a residual film ratio of unexposed portion might be lowered or an image faithful to a mask pattern cannot be obtained. On the other hand, if the mixed amount exceeds 50 parts by weight, a pattern shape might be deteriorated or foams would be generated in hardening.

[1-3] Crosslinked Resin Particle

As the "crosslinked resin particle" in the positive-type photosensitive insulating resin composition of the present invention (hereinafter also referred to as "crosslinked resin particle (C)"), those obtained by co-polymerizing a monomer having hydroxyl group and/or carboxyl group and a crosslinkable monomer having two or more unsaturated polymerizable groups (hereinafter also referred simply as "crosslinkable monomer") are usually used. Moreover, those obtained by polymerizing further other monomers are preferably used.

Examples of the above-mentioned monomer having hydroxyl group and/or carboxyl group include an hydroxyl group-containing unsaturated compound such as hydroxyethyl(metha)acrylate, hydroxypropyl(metha)acrylate and hydroxybutyl(metha)acrylate, an unsaturated acid compound such as (metha)acrylic acid, itaconic acid, succinic acid-β-(metha)acryloxyethyl, maleic acid-β-(metha)acryloxyethyl, phthalic acid-β-(metha)acryloxyethyl and hexahydrophthalic acid-β-(metha)acryloxyethyl, and the like. The monomer having hydroxyl group and/or carboxyl group may be used singly or in combination of two or more types thereof.

The content of a component deriving from the monomer having hydroxyl group and/or carboxyl group in the above-mentioned crosslinked resin particle (C) is in the range from 20% to 90% by mol, preferably from 20% to 70% by mol, and more preferably from 20% to 50% by mol in a value calculated from an acid value, hydroxyl value measured by the method according to JIS standard K0070, when the entire components deriving from the monomers constituting the crosslinked resin particle (C) are 100% by mol. If the content of the component deriving from the monomer having hydroxyl group and/or carboxyl group is less than 20% by mol, dispersion performance thereof in an alkali developer cannot be obtained sufficiently and the patterning performance is lowered. On the other hand, if the content exceeds 90% by mol, a crack might be caused in the resultant hardened film or sufficient elongation may not be obtained.

Additionally, examples of the above-mentioned crosslinkable monomer include a compound having a plural polymerizable unsaturated group such as divinylbenzene, diallyl phthalate, ethylene glycol di(meth)acrylate, propylene glycol di(meth)acrylate, trimethylolpropane tri(meth)acrylate, pentaerythrytol tri(meth)acrylate, polyethylene glycol di(meth)acrylate and polypropylene glycol di(meth)acrylate. Among these, divinylbenzene is preferable. The crosslinkable monomer may be used singly or in combination of two or more types thereof.

The content of a component deriving from the crosslinkable monomer in the above-mentioned crosslinked resin particle (C) is preferably in the range from 1% to 20% by mol, and more preferably from 1% to 10% by mol when the entire components deriving from the monomers constituting the crosslinked resin particle (C) are 100% by mol. When the content of the component deriving from the crosslinkable monomer is in the range from 1% to 20% by mol, a stable particle shape can be obtained, being favorable.

Further, examples of the other monomers include a diene compound such as butadiene, isoprene, dimethyl butadiene, chloroprene and 1,3-pentadiene; an unsaturated nitrile compound such as (meth)acrylonitrile, α-chloroacrylonitrile, α-chloromethyl acrylonitrile, α-methoxy acrylonitrile, α-ethoxy acrylonitrile, crotononitrile, cinnamonitrile, itaconodinitrile, maleodinitrile and fumarodinitrile; an unsaturated amide such as (meth)acrylamide, dimethyl(meth)acrylamide, N,N'-methylenebis(meth)acrylamide, N,N'-ethylenebis(meth)acrylamide, N,N'-hexamethylenebis (meth)acrylamide, N-hydroxymethyl(meth)acrylamide, N-(2-hydroxyethyl)(meth)acrylamide, N,N-bis(2-hydroxyethyl)(meth)acrylamide, crotonamide and cinnamamide; a (meth)acrylate ester such as methyl(meth)acrylate, ethyl (meth)acrylate, propyl(meth)acrylate, butyl(meth)acrylate, hexyl(meth)acrylate, lauryl(meth)acrylate, polyethylene glycol(meth)acrylate and polypropylene glycol(meth)acrylate; an aromatic vinyl compound such as styrene, α-methylstyrene, o-methoxystyrene, p-hydroxystyrene and p-isopropenylphenol; an epoxy(meth)acrylate obtained by reaction of a diglycidyl ether of bisphenol A, diglycidyl ether of glycol or the like with (meth)acrylic acid, a hydroxyalkyl(meth)acrylate or the like; an urethane(meth)acrylate obtained by reaction of a hydroxyalkyl(meth)acrylate with a polyisocyanate; an epoxy group-containing unsaturated compound such as glycidyl(meth)acrylate and (meth)allyl glycidylether; an amino group-containing unsaturated compound such as dimethylamino(meth)acrylate and diethylamino(meth)acrylate; and the like. The other monomers may be used singly or in combination of two or more types thereof.

Among the other monomers, a diene compound, styrene and acrylonitrile are preferable and butadiene is particularly preferred.

The content of a component deriving from the other monomers in the above-mentioned crosslinked resin particle (C) is preferably in the range from 10% to 80% by mol, more preferably from 30% to 80% by mol, and further preferably from 50% to 80% by mol when the entire components deriving from the monomers constituting the crosslinked resin particle (C) are 100% by mol. If the content of the component deriving from the other monomers is less than 10% by mol, sufficient elongation might not be obtained. On the other hand, if the content exceeds 80% by mol, dispersion performance in an alkali developer can not be obtained sufficiently and the patterning performance may be lowered.

The above-mentioned crosslinked resin particle (C) may be used singly or in combination of two or more types thereof.

The glass transition temperature (Tg) of the copolymer constituting the crosslinked resin particle (C) is preferably 20° C. or lower, more preferably 10° C. or lower, and further preferably 0° C. or lower (a lower limit is usually −70° C. or higher). If Tg of the crosslinked resin particle (C) exceeds 20° C., a crack might be caused in the resultant hardened film or sufficient elongation may not be obtained.

Further, the crosslinked resin particle (C) in the present invention is a particulate copolymer, and an average particle size of the crosslinked resin particle (C) is preferably in the range from 30 to 500 nm, more preferably from 40 to 200 nm, and further preferably from 50 to 120 nm.

A control method of the particle size of the crosslinked resin particle (C) is not particularly limited. In the case where the crosslinked resin particle is to be synthesized by emulsion polymerization, the particle size can be controlled by controlling the number of micelle in the emulsion polymerization by an emulsifier amount to be used.

The average particle size of the crosslinked resin particle (C) in the present invention is a value measured using a light dispersion flow distribution measuring device "LPA-3000" by Otsuka Electronics Co., Ltd. after diluting a dispersed solution of the crosslinked resin particles according to a normal method.

A compounding amount of the above-mentioned crosslinked resin particle (C) is preferably in the range from 1 to 200 parts by weight, more preferably from 1 to 150 parts by weight, and further preferably from 1 to 100 parts by weight based on 100 parts by weight of the above-mentioned alkali-soluble resin (A). If the compounding amount of the crosslinked resin particle (C) is less than 1 part by weight, a crack might be caused in the resultant hardened film and sufficient elongation may not be obtained. On the other hand, if the compounding amount exceeds 200 parts by weight, a residue of the crosslinked resin particle (C) might be caused at development and sufficient patterning performance might not be obtained.

[1-4] Crosslinking Agent

Additionally, the positive-type photosensitive insulating resin composition of the present invention may contain a crosslinking agent (hereinafter also referred to as "crosslinking agent (D)").

Examples of the above-mentioned crosslinking agent is not particularly limited so long as it functions as a crosslinkable component (a hardening component) reacting with the above-mentioned alkali-soluble resin (A). Examples of the crosslinking agent (D) include a compound having two or more alkyl-etherified amino groups in its molecule, a compound having a thiirane ring, a compound having an oxetanyl group, a compound having an isocyanate group (including a blocked compound), a phenolic compound having an aldehyde group, a phenolic compound having a methylol group, and the like. In particular, o-hydroxy benzaldehyde, 2,6-bis (hydroxymethyl)-p-cresol, hexamethoxymethyl melamine and the like are suitably used.

Examples of the compound having two or more alkyl-etherified amino groups in its molecule include a compound wherein an active methylol group ($CH_2OH$ groups) of a nitrogen-containing compound such as (poly)methylolated melamine, (poly)methylolated glycoluryl, (poly)methylolated benzoguanamine and (poly)methylolated urea is completely or partially (at least two groups) alkyl-etherified. Examples of the alkyl group constituting the alkyl ether include methyl group, ethyl group, butyl group and the like. These groups may be either the same or different. The above-mentioned compound may be one wherein a methylol group not alkyl-etherified is self-condensed in its molecule. Alternatively, such groups in two molecules may be condensed together to thereby form an oligomer component. The specific examples includes hexamethoxymethyl melamine, hexabutoxymethyl melamine, tetramethoxymethyl glycoluryl, tetrabutoxymethyl glycoluryl and the like. The crosslinking agent (D) may be used singly or in combination of two or more types thereof.

The compounding amount of the crosslinking agent (D) in the present invention is preferably in the range from 1 to 100 parts by weight, and more preferably from 5 to 50 parts by weight based on 100 parts by weight of the above-mentioned alkali-soluble resin (A). If the compounding amount of the crosslinking agent (D) is less than 1 part by weight, hardening by exposure might be insufficient or electrical insulation property of the resultant hardened material might be lowered. On the other hand, if the amount exceeds 100 parts by weight, the patterning characteristics might be lowered or heat resistance might be lowered.

[1-5] Compound Having at Least Two Oxirane Rings in its Molecule

In addition, the positive-type photosensitive insulating resin composition of the present invention may contain a compound having at least two oxirane rings in a molecule (hereinafter also referred to as "oxirane ring containing compound (E)") in order to further improve resolution and chemical resistance of the resultant hardened film.

Examples the above-mentioned compound having an oxirane ring include a phenol novolak type epoxy resin, a cresol novolak type epoxy resin, a bisphenol type epoxy resin, a trisphenol type epoxy resin, a tetraphenol type epoxy resin, a phenol-xylylene type epoxy resin, a naphthol-xylylene type epoxy resin, a phenol-naphthol type epoxy resin, a phenol-dicylopentadiene type epoxy resin, an alicyclic epoxy resin, an aliphatic epoxy resin and the like. Among them, a phenol novolak type epoxy resin, a cresol novolak type epoxy resin, a phenol-dicylopentadiene type epoxy resin, a bisphenol A type epoxy resin, an aliphatic epoxy resin are suitably used. The compound having an oxirane ring (E) may be used singly or in combination of two or more types thereof.

A compounding amount of the oxirane ring containing compound (E) in the present invention is preferably in the range from 1 to 70 parts by weight, and more preferably from 3 to 30 parts by weight based on 100 parts by weight of the above-mentioned alkali-soluble resin (A). When the compounding amount of the oxirane ring containing compound (E) is in the rang from 1 to 70 parts by weight, resolution and chemical resistance of the resultant hardened film can be further improved, being favorable.

[1-6] Adhesion Aid

In addition, the positive-type photosensitive insulating resin composition of the present invention may further contain an adhesion aid (hereinafter referred to as "adhesion aid (F)") for the purpose of improving adhesion to the base material.

Examples of the above-mentioned adhesion aid (F) include a functional silane coupling agent having a reactive substituent such as carboxyl group, methacryloyl group, isocyanate group and epoxy group, and the like. Specific examples thereof include trimethoxysilyl benzoic acid, γ-methacryloxypropyl trimethoxysilane, vinyltriacetoxysilane, vinyltrimethoxysilane, γ-isocyanatopropyl triethoxysilane, γ-glycidoxypropyl trimethoxysilane, β-(3,4-epoxycyclohexyl)ethyl trimethoxysilane, 1,3,5-N-tris(trimethoxysilylpropyl)isocyanulate and the like. The adhesion aid (F) may be used singly or in combination of two or more types thereof.

The compounding amount of the above-mentioned adhesion aid (F) is preferably in the range from 0.5 to 10 parts by weight and more preferably 0.5 to 8 parts by weight based on 100 parts by weight of the above-mentioned alkali-soluble resin (A). When the compounding amount of the adhesion aid (F) is in the range from 0.5 to 10 parts by weight, the obtained composition is excellent in storage stability and shows favorable adhesion to a base material.

[1-7] Solvent

Further, the positive-type photosensitive insulating resin composition of the present invention may contain a solvent (hereinafter referred to as "solvent (G)") to improve the handling properties of the resin composition and control the viscosity and storage stability thereof.

The above-mentioned solvent (G) is not particularly limited, however, example thereof includes an ethylene glycol monoalkyl ether acetate such as ethylene glycol monomethyl ether acetate and ethylene glycol monoethyl ether acetate; a propylene glycol monoalkyl ether such as propylene glycol monomethyl ether, propylene glycol monoethyl ether, propylene glycol monopropyl ether and propylene glycol monobutyl ether; a propylene glycol dialkyl ether such as propylene glycol dimethyl ether, propylene glycol diethyl ether, propylene glycol dipropyl ether and propylene glycol dibutyl ether; a propylene glycol monoalkyl ether acetate such as propylene glycol monomethyl ether acetate, propylene glycol monoethyl ether acetate, propylene glycol monopropyl ether acetate and propylene glycol monobutyl ether acetate; a cellosolve such as ethyl cellosolve and butyl cellosolve; a carbitol such as butyl carbitol; a lactate such as methyl lactate, ethyl lactate, n-propyl lactate and isopropyl lactate; an aliphatic carboxylate such as ethyl acetate, n-propyl acetate, isopropyl acetate, n-butyl acetate, isobutyl acetate, n-amyl acetate, isoamyl acetate, isopropyl propionate, n-butyl propionate and isobutyl propionate; other esters such as methyl 3-methoxypropionate, ethyl 3-methoxypropionate, methyl 3-ethoxypropionate, ethyl 3-ethoxypropionate, methyl pyruvate and ethyl pyruvate; an aromatic hydrocarbon such as toluene and xylene; a ketone such as 2-heptanone, 3-heptanone, 4-heptanone and cyclohexanone; an amide such as N-dimethylformamide, N-methylacetamide, N,N-dimethylacetamide and N-methylpyrrolidone; and a lactone such as γ-butyrolactone. The solvent (G) may be used singly or in combination of two or more types thereof.

[1-8] Other Additives

Moreover, the positive-type photosensitive insulating resin composition of the present invention may contain other additives as necessary (hereinafter also referred to as "other additives (H)") to an extent that does not damage the characteristics of the present invention. The other additives (H) include a thermo-sensitive acid generator, a sensitizer, a leveling agent-surface active agent and the like.

The thermo-sensitive acid generator is not particularly limited so long as it is a compound generating acid by heating processing, and a reaction between a functional group such as an alkyl ether group in the crosslinking agent (D) and the alkali-soluble resin (A) is promoted by a catalytic action of the generated acid. The thermo-sensitive acid generator includes an onium salt compound and the like, for example.

The above-mentioned leveling agent-surface activating agent is usually incorporated for the purpose of improving coating performance of the resin composition. This leveling agent-surface activating agent is not particularly limited. The preferred is a nonion-based leveling agent-surface activating agent and examples thereof include a polyoxyethylene alkyl ether such as polyoxyethylene lauryl ether, polyoxyethylene stearyl ether, polyoxyethylene cetyl ether and polyoxyethylene oreyl ether; a polyoxyethylene alkyl allyl ether such as polyoxyethylene octylphenol ether and polyoxyethylene nonylphenol ether; a polyoxyethylene polyoxypropylene block copolymer; a sorbitan fatty acid ester such as sorbitan monolaurate, sorbitan monopalmitate and sorbitan monostearate; a polyoxyethylene sorbitan fatty acid ester such as polyoxyetheylene sorbitan monolaurate, polyoxyetheylene sorbitan monopalmitate, polyoxyetheylene sorbitan monostearate, polyoxyetheylene sorbitan trioleate and polyoxyetheylene sorbitan tristearate; a fluorine-based leveling agent-surface activating agent including "Eftop EF301", "Eftop EF303" and "Eftop EF352" manufactured by Tochem Products Corp., "Megafak F171", "Megafak F172" and "Megafak F173" manufactured by Dainippon ink and chemicals Inc., "Fluorad FC430" and "Fluorad FC431" manufactured by Sumitomo 3M Ltd., "Asahiguard AG710", "Surfron S-381", "Surfron S-382", "Surfron SC101", "Surfron SC102", "Surfron SC103", "Surfron SC104", "Surfron SC105", "Surfron SC106", "Surfynol E1004", "KH-10", "KH-20", "KH-30" and "KH-40" manufactured by Asahi glass Co., Ltd., "Ftergent 250", "Ftergent 251", "Ftergent 222F" and "FTX-218" manufactured by NEOS COMPANY LIMITED; an organosiloxane polymer such as "KP341", "X-70-092" and "X-70-093" manufactured by Shin-etsu Chemical Co., Ltd., "SH8400" manufactured by Dow Corning Toray Co., Ltd.; an acrylic or an methacrylic leveling agent such as "POLYFLOW No. 75", "POLYFLOW No. 77", "POLYFLOW No. 90" and "POLYFLOW No. 95" manufactured by Kyoeisha Chemical Co., Ltd.; and the like. The leveling agent-surface activating agent may be used singly or in combination of two or more types thereof.

The compounding amount of the above-mentioned leveling agent-surface activating agent in a resin solution is preferably in the range from 50 to 1,000 ppm and more preferably from 100 to 800 ppm. If the amount is less than 50 ppm, the resin composition is not uniformly applied onto a stepped base material. And if the amount exceeds 1,000 ppm, adhesion during development and after hardening is deteriorated.

[1-9] Preparation Method

The method of preparing the positive-type photosensitive insulating resin composition of the present invention is not particularly limited and can be produced by publicly known methods. It is also possible to prepare the composition by stirring the contents in the state where a bottle containing starting components is on a wave rotor while sealing tightly with a plug.

[2] Hardened Material (i)

The hardened material in the present invention (hereinafter also referred to as "hardened material (i)") is characterized by obtained hardening the positive-type photosensitive insulation resin composition.

The above-mentioned positive-type photosensitive insulating resin composition according to the present invention is excellent in characteristics such as resolution, adhesion, thermal shock resistance, electrical insulation property, patterning performance, elongation and the like, and its hardened material can be suitably used for a surface-protecting film, a planarized film, an interlayer insulation film, an insulating film material for high-density mounting board and the like in electronic parts including a circuit board (semiconductor element), a semiconductor package and the like. Particularly, the above-mentioned hardened material can be used as an interlayer insulation film or planarized film to form a circuit board.

The hardened material (i) of the present invention is prepared as follows. First, the above-mentioned positive-type photosensitive insulating resin composition of the present invention is coated on a base material such as a resin-coated copper foil, a copper clad laminate, and a silicon wafer and alumina plate each having a sputtered metal film, and the coating is subjected to drying to evaporate a solvent and the like, thereby forming a resin film. After that, the resin film is exposed to light through a mask having a desired pattern. Subsequently, development is conducted using an alkaline developer and the exposed part is dissolved to remove. Thus a desired pattern can be obtained. And then, heating is further conducted to obtain a hardened film for the purpose of expressing the insulating film characteristics.

Examples of the method of coating the resin composition on the base material include dipping method, spraying method, bar coating method, roll coating method, spin coating method, curtain coating method and the like. In addition, the thickness of the coating film may be controlled by selecting the coating method and the solid content or viscosity of the composition.

Examples of radiation to be used for exposure include ultraviolet light emitted from a low-pressure mercury lamp, a high-pressure mercury lamp, a metal halide lamp, a g-line stepper, and an i-line stepper, electron beam, laser beam and the like. The exposure dose may be appropriately determined depending on the radiation source used, the thickness of the resin film and the like. In the case where a resin film having a thickness of 5 to 50 µm is radiated with ultraviolet light emitted from a high-pressure mercury lamp, for example, the exposure dose is usually in the range from about 1,000 to 20,000 $J/m^2$.

After the completion of the exposure, an alkaline developer is used for development and the exposed part is dissolved to remove. Thus a desired pattern is formed. Examples of the developing method include shower development method, spray development method, immersion development method, puddle development method and the like. The development is usually conducted at a temperature in the range from 20° C. to 40° C., for about 1 to 10 minutes.

Examples of the above-mentioned alkaline developer include an alkaline aqueous solution prepared by dissolving an alkaline compound such as sodium hydroxide, potassium hydroxide, ammonia water, tetramethyl ammonium hydroxide and choline in water so as to have the concentration of the above-mentioned alkaline compound of about 1% to 10% by weight. The alkaline aqueous solution may further contain an appropriate amount of a water-soluble organic solvent such as methanol and ethanol, a surfactant and the like. After developing with the alkaline developer, water washing and drying are usually carried out.

In order to give the characteristics as an insulating film, the film is heated to sufficiently harden after development. The conditions for hardening are not particularly limited and are selected depending on the purpose of the use of the hardened material. For example, the film is heated at a temperature in the range from 100° C. to 250° C., for about 30 minutes to 10 hours to harden. Furthermore, it is also possible to carry out the heat treatment in two stages so as to allow a sufficient hardening progress and to avoid deformation of the obtained pattern shape. For example, at the first step, the heat treatment may be carried out at a temperature in the range from 50° C. to 100° C., for about 10 minutes to 2 hours, and at the second step of heating at 100° C. to 250° C., for about 20 minutes to 8 hours for hardening. Under these conditions, the heat treatment may be conducted with an oven, an infrared oven and the like commonly employed as a heating apparatus in the art.

Figure 2:
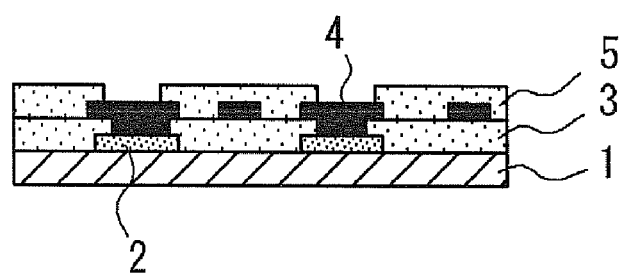
FIG. 2 is a schematic diagram for showing a section of a circuit board.

According to the positive-type photosensitive insulating resin composition of the present invention, electronic parts such as a circuit board (semiconductor element) shown in FIGS. 1 and 2 can be formed. That is, after a metal pad 2 is formed in a pattern on a substrate 1, a hardened insulating film 3 is formed in a pattern using the above-mentioned resin composition and then, a metal wiring 4 is formed in a pattern so that a circuit board as shown in FIG. 1 can be obtained. Additionally, when a hardened insulating film 5 is formed on it using the above-mentioned resin composition, a circuit board as shown in FIG. 2 can be obtained.

[3] Negative-Type Photosensitive Insulating Resin Composition

The negative-type photosensitive insulating resin composition of the present invention comprises an alkali-soluble resin, a crosslinking agent, a photosensitive acid generator, and a crosslinked resin particle consisting of a particulate copolymer containing a constituent derived from a monomer having a hydroxyl group and/or a carboxyl group in an amount of 20% to 90% by mol.

[3-1] Alkali-Soluble Resin

The alkali-soluble resin in the negative-type photosensitive insulating resin composition of the present invention (hereinafter also referred to as "alkali-soluble resin (I)") can have the explanation on the alkali-soluble resin (A) described in the positive-type photosensitive insulating resin composition applied as it is. The alkali-soluble resin (I) may contain the phenolic low-molecular compound similarly to the case of the alkali-soluble resin (A).

Additionally, the content of the alkali-soluble resin (I) in the negative-type photosensitive insulating resin composition of the present invention is preferably in the range from 20% to 90% by weight, and more preferably from 30% to 80% by weight based on 100% by weight of the total solid portion excluding a solvent. If the alkali-soluble resin (A) is contained in an amount 20% to 90% by weight, a film formed using the negative-type photosensitive insulating resin composition has a sufficient development performance by an alkaline aqueous solution, being favorable.

[3-2] Crosslinking Agent

The "crosslinking agent" in the negative-type photosensitive insulating resin composition of the present invention (hereinafter also referred to as "crosslinking agent (J)") is not particularly limited so long as it functions as a crosslinking component (hardening component) which reacts with the above-mentioned alkali-soluble resin (I). The crosslinking agent (J) can have the explanation on the crosslinking agent (D) described in the positive-type photosensitive insulating resin composition applied as it is.

Further, the compounding amount of the crosslinking agent (J) in the negative-type photosensitive insulating resin composition of the present invention is preferably in the range from 1 to 100 parts by weight, and more preferably from 5 to 50 parts by weight based on 100 parts by weight of the above-mentioned alkali-soluble resin (I). If the compounding amount of the crosslinking agent (J) is less than 1 part by weight, hardening by exposure might be insufficient, patterning might become difficult or heat resistance of the resultant hardened material might be lowered. On the other hand, if the amount exceeds 100 parts by weight, resolution might be lowered or electrical insulation property might be lowered.

[3-3] Photosensitive Acid Generator

The "photosensitive acid generator" in the negative-type photosensitive insulating resin composition of the present invention (hereinafter also referred to as "acid generator (K)") is a compound which generates an acid upon irradiation with a radiation or the like. And a functional group in the crosslinking agent (J) and the above-mentioned alkali-soluble resin (I) react with dealcoholization by a catalytic action of this acid and can form a negative-type pattern.

Example of the above-mentioned acid generator (K) includes an s-triazine derivative represented by the following general formula (6). This s-triazine derivative has a wide absorption range including g-line, h-line and i-line and exhibits a higher acid generation efficiency than commonly employed radiation sensitive acid generators having a triazine skeleton. Thus, when this s-triazine derivative is contained, an insulating hardened material having a high residual film ratio can be obtained.

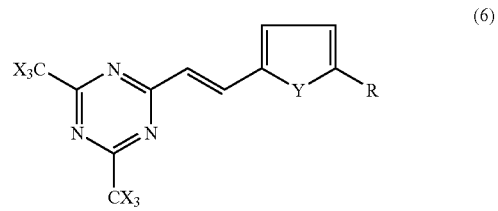

[In the formula (6), R is hydrogen atom, an alkyl group having 1 to 4 carbon atoms or an alkoxyl group with carbon number of 1 to 4, X is a halogen atom and Y is oxygen atom or sulfur atom.]

In the case R is an alkyl group with carbon number of 1 to 4 in the general formula (1) above, examples of the alkyl group methyl group, ethyl group, n-propyl group, isopropyl group, n-butyl group, isobutyl group, sec-butyl group, tert-butyl group and the like. In addition, when R is an alkoxyl group with carbon number of 1 to 4, example thereof includes methoxy group, ethoxy group, propoxy group, isopropoxy group, n-butoxy group, isobutoxy group, sec-butoxy group and the like.

Among these groups, R is preferably hydrogen atom or an alkyl group with carbon number of 1 to 4. And hydrogen atom, methyl group or ethyl group is more preferable.

In the general formula (6), X representing a halogen atom is preferably fluorine atom, chlorine atom, bromine atom or iodine atom. And chlorine atom is more preferable.

Examples of the s-triazine derivative represented by the above general formula (1) include 2-[2-(furan-2-yl)ethenyl]-4,6-bis(trichloromethyl)-s-triazine (Y=O, R=H, X=Cl), 2-[2-(5-methylfuran-2-yl)ethenyl]-4,6-bis(trichloromethyl)-s-triazine (Y=O, R=CH$_3$, X=Cl) and the like.

Further, examples of the above-mentioned acid generator (K) include an onium salt compound, a halogen-containing compound, a diazoketone compound, a sulfone compound, a sulfonic acid compound, a sulfonimide compound, a diazomethane compound and the like.

Examples of the above-mentioned onium compounds include an iodonium salt, a sulfonium salt, a phosphonium salt, a diazonium salt, a pyridinium salt and the like. Specific examples thereof include diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium p-toluenesulfonate, triphenylsulfonium hexafluoroantimonate, 4-tert-butylphenyl.diphenylsulfonium trifluoromethanesulfonate, 4-tert-butylphenyl.diphenylsulfonium p-toluenesulfonate, 4,7-di-n-butoxynaphthyl tetrahydrothiophenium trifluoromethanesulfonate and the like.

Examples of the above-mentioned halogen-containing compound include a haloalkyl group-containing hydrocarbon compound, a haloalkyl group-containing heterocyclic compound and the like. Specific examples thereof include 1,10-dibromo-n-decane, 1,1-bis(4-chlorophenyl)-2,2,2-trichloroethane and an s-triazine derivative such as phenyl-bis(trichloromethyl)-s-triazine, 4-methoxyphenyl-bis(trichloromethyl)-s-triazine, styryl-bis(trichloromethyl)-s-triazine, naphthyl-bis(trichloromethyl)-s-triazine and 2,4-trichloromethyl(piperonyl)-s-trizaine.

Examples of the above-mentioned diazoketone compound include a 1,3-diketo-2-diazo compound, a diazobenzoquinone compound, a diazonaphthoquinone compound and the like. Specific examples thereof include a 1,2-naphthoquinonediazido-4-sulfonic acid ester compound of a phenolic compound, and the like.

Examples of the above-mentioned sulfone compound include a β-ketosulfone compound, a β-sulfonylsulfone compound, an α-diazo compound of these compounds, and the like. Specific examples thereof include 4-trisphenacylsulfone, mesitylphenacylsulfone, bis(phenacylsulfonyl)methane and the like.

Examples of the above-mentioned sulfonic acid compound include an alkylsulfonic acid ester, a haloalkylsulfonic acid ester, an arylsulfonic acid ester, an iminosulfonate and the like. Specific examples thereof include benzoin tosylate, pyrogallol tristrifluoromethanesulfonate, o-nitrobenzyl trifluoromethanesulfonate, o-nitrobenzyl p-toluenesulfonate and the like.

Examples of the above-mentioned sulfonimide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicaboxyimide, N-(trifluoromethylsulfonyloxy)naphthylimide and the like.

Examples of the above-mentioned diazomethane compound include bis(trifluoromethylsulfonyl)diazomethane, bis(cyclohexylsulfonyl)diazomethane, bis(phenylsulfonyl)diazomethane and the like.

The acid generator (K) may be contained singly or in combination of two or more types thereof.

The compounding amount of the acid generator (K) is preferably in the range from 0.1 to 10 parts by weight, and more preferably from 0.3 to 5 parts by weight based on 100 parts by weight of the above-mentioned alkali-soluble resin (I) from the viewpoint to ensure sensitivity, resolution, pattern shape and the like of the negative-type photosensitive insulating resin composition of the present invention. If the compounding amount of the acid generator (K) is less than 0.1 parts by weight, hardening by exposure becomes insufficient and residual film ratio might be lowered. On the other hand, if the compounding amount exceeds 10 parts by weight, transparency to the radiation is lowered and the pattern shape might be deteriorated.

[3-4] Crosslinked Resin Particle

The "crosslinked resin particle" in the negative-type photosensitive insulating resin composition of the present invention (hereinafter also referred to as "crosslinked resin particle (L)") can have the explanation on the crosslinked resin particle (C) described in the positive-type photosensitive insulating resin composition applied as it is.

Additionally, the compounding amount of the crosslinked resin particle (L) is preferably in the range from 1 to 200 parts by weight, more preferably from 1 to 150 parts by weight, and further preferably from 1 to 100 parts by weight based on 100 parts by weight of the above-mentioned alkali-soluble resin (I). If the compounding amount of the crosslinked resin particle (L) is less than 1 part by weight, a crack might be caused in the resultant hardened film and sufficient elongation might not be obtained. On the other hand, if the compounding amount exceeds 200 parts by weight, a residue of the crosslinked resin particle (L) might be caused at development and sufficient patterning performance might not be obtained.

[3-5] Compound Having at Least Two Oxirane Rings in Molecule

In addition, the negative-type photosensitive insulating resin composition of the present invention may contain a compound having at least two oxirane rings in a molecule (hereinafter also referred to as "oxirane ring containing compound (M)") in order to further improve resolution and chemical resistance of the obtained hardened film.

The oxirane ring containing compound (M) can have the description on the oxirane ring containing compound (E) described in the above-mentioned positive-type photosensitive insulating resin composition applied as it is.

Further, the compounding amount of the oxirane ring containing compound (M) in the present invention is preferably in the range from 1 to 70 parts by weight, and more preferably from 3 to 30 parts by weight based on 100 parts by weight of the above-mentioned alkali-soluble resin (I). When the compounding amount of the oxirane ring containing compound (M) is in the range from 1 to 70 parts by weight, resolution and chemical resistance of the resultant hardened film can be further improved, being favorable.

[3-6] Adhesion Aid

The negative-type photosensitive insulating resin composition of the present invention may contain an adhesion aid in order to improve adhesion with a base material (hereinafter also referred to as "adhesion aid (N)").

The adhesion aid (N) can have the description on the adhesion aid (F) described in the above-mentioned positive-type photosensitive insulating resin composition applied as it is.

Additionally, the compounding amount of the adhesion aid (N) is preferably in the range from 0.5 to 10 parts by weight, and more preferably from 0.5 to 8 parts by weight based on 100 parts by weight of the above-mentioned alkali-soluble resin (I). When the compounding amount of the adhesion aid (N) is in the range from 0.5 to 10 parts by weight, storage stability is excellent and favorable adhesion with the base material can be ensured, which is preferable.

[3-7] Solvent

Further, the negative-type photosensitive insulating resin composition of the present invention may contain a solvent (hereinafter also referred to as "solvent (O)") in order to improve handling performance of the resin composition, and adjust viscosity and storage stability.

The solvent (O) can have the description on the solvent (G) described in the above-mentioned positive-type photosensitive insulating resin composition applied as it is.

[3-8] Other Additives

Moreover, the negative-type photosensitive insulating resin composition of the present invention may contain other additives as necessary (hereinafter also referred to as "other additives (P)") to an extent that does not damage the characteristics of the present invention. Examples of the other additives (P) include a sensitizer, a leveling agent-surface activating agent and the like.

The above-mentioned leveling agent-surface activating agent is usually incorporated for the purpose of improving coating performance of the resin composition. The leveling agent/surface active agent can have the description on the leveling agent/surface active agent described in the other additives (H) of the above-mentioned positive-type photosensitive insulating resin composition applied as it is.

The compounding amount of the above-mentioned leveling agent-surface activating agent in a resin solution is preferably in the range from 50 to 1,000 ppm and more preferably from 100 to 800 ppm. If the amount is less than 50 ppm, the resin composition is not uniformly applied onto a stepped base material. And if the amount exceeds 1,000 ppm, adhesion during development and after hardening is deteriorated.

[3-9] Preparing Method

The method of preparing the negative-type photosensitive insulating resin composition of the present invention is not particularly limited and can be produced by publicly known methods. It is also possible to prepare the composition by stirring the contents in the state where a bottle containing starting components is on a wave rotor while sealing tightly with a plug.

[4] Hardened Material (ii)

The hardened material in the present invention (hereinafter also referred to as "hardened material (ii)") is characterized by obtained hardening the negative-type photosensitive insulation resin composition.

The above-mentioned negative-type photosensitive insulating resin composition according to the present invention is excellent in characteristics such as resolution, adhesion, thermal shock resistance, electrical insulation property, patterning performance, elongation and the like, and its hardened material can be suitably used for a surface-protecting film, a planarized film, an interlayer insulation film and the like in electronic parts including a circuit board (semiconductor element), a semiconductor package and the like. Particularly, the above-mentioned hardened material can be used as an interlayer insulation film or planarized film to form a circuit board.

The hardened material (ii) of the present invention is prepared as follows. First, the above-mentioned negative-type photosensitive insulating resin composition of the present invention is coated on a base material such as a resin-coated copper foil, a copper clad laminate, and a silicon wafer and alumina plate each having a sputtered metal film, and the coating is subjected to drying to evaporate a solvent and the like, thereby forming a resin film. After that, the resin film is exposed to light through a mask having a desired pattern and heated (hereinafter, referred to "PEB") to thereby promote the reaction between the alkali-soluble resin (I) and the crosslinking agent (J). Subsequently, development is conducted using an alkaline developer and the unexposed part is dissolved to remove. Thus a desired pattern can be obtained. And then, heating is further conducted to obtain a hardened film for the purpose of expressing the insulating film characteristics.

As a method of coating the resin composition on the base material, coating method described above can be applied.

In addition, the thickness of the coating film may be controlled by selecting the coating method and the solid content or viscosity of the composition.

Examples of radiation to be used for exposure include ultraviolet light emitted from a low-pressure mercury lamp, a high-pressure mercury lamp, a metal halide lamp, a g-line stepper, an h-line stepper and an i-line stepper, electron beam, laser beam and the like. The exposure dose may be appropriately determined depending on the radiation source used, the thickness of the resin film and the like. In the case where a resin film having a thickness of 10 to 50 μm is radiated with ultraviolet light emitted from a high-pressure mercury lamp, for example, the exposure dose is usually in the range from about 1,000 to 20,000 J/m$^2$.

After the completion of the exposure, the PEB is conducted to promote a hardening reaction between the alkali-soluble resin (I) and the crosslinking agent (J) by an acid generated. The conditions for the PEB vary depending on a composition of contained components in the resin composition such as formulated amounts, a film thickness and the like. In usual, the PEB treatment is conducted at a temperature in the range from 70° C. to 150° C. and preferably from 80° C. to 120° C., for about 1 to 60 minutes. Subsequently, the film is developed with an alkaline developer and the non-exposed part is dissolved to remove. Thus a desired pattern is formed. Examples of the developing method include shower development method, spray development method, immersion development method, puddle development method and the like. The development is usually conducted at a temperature in the range from 20° C. to 40° C., for about 1 to 10 minutes.

Examples of the above-mentioned alkaline developer include the above-mentioned alkaline aqueous solution. In addition, the alkaline aqueous solution may further contain an appropriate amount of a water-soluble organic solvent such as methanol and ethanol, a surfactant and the like. After developing with the alkaline developer, water washing and drying are usually carried out.

In order to give the characteristics as an insulating film, the film is heated to sufficiently harden after development. The conditions for hardening are not particularly limited and are selected depending on the purpose of the use of the hardened material. For example, the film is heated at a temperature in the range from 50° C. to 250° C., for about 30 minutes to 10 hours to harden. Furthermore, it is also possible to carry out the heat treatment in two stages so as to allow a sufficient hardening progress and to avoid deformation of the obtained pattern shape. For example, at the first step, the heat treatment may be carried out at a temperature in the range from 50° C. to 120° C., for about 5 minutes to 2 hours, and at a temperature from 80° C. to 250° C., for about 10 minutes to 10 hours for hardening. Under these conditions, the heat treatment may be conducted with an oven, an infrared oven and the like commonly employed as a heating apparatus in the art.

According to the negative-type photosensitive insulating resin composition of the present invention, electronic parts such as a circuit board as shown in FIGS. 1 and 2 can be formed similarly to the case in which the above-mentioned positive-type photosensitive insulating resin composition is used.

EXAMPLES

Hereinafter, the present invention will be described in greater detail by referring to the following Examples. The present invention is in no way limited by these Examples.

<Preparation and Evaluation of Photosensitive Insulating Resin Composition>

[1-1] Preparation of Positive-Type Photosensitive Insulating Resin Composition

Example 1

As shown in Table 1, 100 parts by weight of [A] alkali-soluble resin (A-1), 20 parts by weight of [B] quinone-diazide compound (B-1), 5 parts by weight of [C] crosslinked resin particle (C-1) and 2.5 parts by weight of [F] adhesion aid (F-1): were solved in 145 parts by weight of [G] solvent (G-1) to prepare a positive-type photosensitive insulating resin composition.

Examples 2 to 10 and Comparative Examples 1 to 6

As shown in Table 1, [A] alkali-soluble resin, [B] quinone-diazide compound, [C] crosslinked resin particle, [D] crosslinking agent, [E] oxirane ring containing compound, [F] adhesion aid and [H] other additives were solved in [G] solvent in the same manner as in Example 1 to prepare each positive-type photosensitive insulating resin composition.

TABLE 1

|  | (A) Alkali-soluble resin (type/parts) | (B) Quinone-diazide compound (type/parts) | (C) Crosslinked resin particle (type/parts) | (D) Crosslinking agent (type/parts) | (E) Oxirane ring containing compound (type/parts) | (F) Adhesion aid (type/parts) | (G) Solvent (type/parts) | (H) Additive (type/parts) |
|---|---|---|---|---|---|---|---|---|
| Example 1 | A-1/100 | B-1/20 | C-1/5 | — | — | F-1/2.5 | G-1/145 | — |
| Example 2 | A-2/100 | B-2/20 | C-3/60 | — | — | F-2/2.5 | G-1/145 | — |
| Example 3 | A-3/100 | B-1/20 | C-2/80 | D-1/35 | — | F-1/2.5 | G-2/145 | — |
| Example 4 | A-3/100 | B-1/20 | C-4/5 | D-1/15 | E-1/15 | F-1/2.5 | G-1/145 | — |
| Example 5 | A-3/100 | B-1/20 | C-4/20 | — | E-1/30 | F-1/2.5 | G-1/145 | — |
| Example 6 | A-4/100 | B-2/20 | C-5/40 | D-3/15 | E-2/20 | F-2/2.5 | G-2/145 | — |
| Example 7 | A-4/100 | B-2/20 | C-2/120 | D-2/25 | E-3/10 | F-2/2.5 | G-2/145 | — |
| Example 8 | A-5/100 | B-2/20 | C-1/180 | D-3/20 | E-3/15 | F-2/2.5 | G-2/145 | — |
| Example 9 | A-2/100 | B-1/25 | C-8/25 | D-3/20 | E-4/5 E-5/5 | F-2/5 | G-1/145 | H-1/0.1 |
| Example 10 | A-2/100 | B-1/25 | C-9/25 | D-3/20 | E-5/10 | F-2/5 | G-1/145 | H-2/0.1 |
| Comparative Example 1 | A-1/100 | B-1/20 | — | — | — | F-1/2.5 | G-1/145 | — |
| Comparative Example 2 | A-2/100 | B-1/20 | — | D-1/35 | — | F-1/2.5 | G-1/145 | — |
| Comparative Example 3 | A-3/100 | B-2/20 | — | D-2/25 | E-1/15 | F-1/2.5 | G-2/145 | — |
| Comparative Example 4 | A-3/100 | B-2/20 | — | — | E-1/15 | F-1/2.5 | G-2/145 | — |
| Comparative Example 5 | A-4/100 | B-1/20 | C-6/50 | D-2/25 | E-2/20 | F-2/2.5 | G-1/145 | — |
| Comparative Example 6 | A-5/100 | B-2/20 | C-7/80 | D-3/20 | E-3/10 | F-2/2.5 | G-2/145 | — |

The components described in Table 1 are as follows:

<[A] Alkali-Soluble Resin>

A-1; Copolymer of vinyl benzoate/styrene=20/80 (mol ratio), polystyrene converted weight-average molecular weight (Mw)=10,000, A-2; Copolymer of p-hydroxystyrene/styrene=80/20 (mol ratio), Mw=10,000, A-3; Polyhydroxystyrene, Mw=10,000, A-4; Copolymer of p-hydroxystyrene/styrene/hydroxybutyl acrylate=80/10/10 (mol ratio), Mw=10,000, A-5; Cresol novolak resin of m-cresol/p-cresol=60/40 (mol ratio), Mw=6,500, <[B] Quinone-Diadide Compound>

B-1; Ester compound of 1,1-bis(4-hydroxyphenyl)-1-[4-[1-(4-hydroxyphenyl)-1-methylethyl]phenyl]ethane and 1,2-naphthoquinone-diazide-5-sulfonic acid (2.0 mol condensate), B-2; Ester compound of 1,1-bis(4-hydroxyphenyl)-1-phenylethane and 1,2-naphthoquinone-diazide-5-sulfonic acid (1.5 mol condensate), <[C] Crosslinked Resin Particle>

C-1; Butadiene/hydroxybutyl methacrylate/divinylbenzene=65/33/2 (% by mol), average particle diameter=65 nm, Tg=−38° C., hydroxyl value=205 mgKOH/g, C-2; Butadiene/hydroxybutyl methacrylate/methacrylic acid/divinylbenzene=40/42/17/1 (% by mol), average particle diameter=65 nm, Tg=5° C., acid value=91 mgKOH/g, hydroxyl value=318 mgKOH/g, C-3; Butadiene/styrene/hydroxybutyl methacrylate/methacrylic acid/divinylbenzene=60/10/20/9/1 (% by mol), average particle diameter=65 nm, Tg=−25° C., acid value=60 mgKOH/g, hydroxyl value=194 mgKOH/g, C-4; Butadiene/acrylonitrile/hydroxybutyl methacrylate/methacrylic acid/divinylbenzene=50/20/17/12/1 (% by mol), average particle diameter=65 nm, Tg=−6° C., acid value=88 mgKOH/g, hydroxyl value=213 mgKOH/g, C-5; Butadiene/methacrylic acid/divinylbenzene= 78/20/2 (% by mol), average particle diameter=65 nm, Tg=−40° C., acid value=180 mgKOH/g, C-6; Butadiene/styrene/hydroxybutyl methacrylate/methacrylic acid/divinylbenzene=63/22/5/8/2 (% by mol), average particle diameter=65 nm, Tg=−27° C., acid value=60 mgKOH/g, hydroxyl value=98 mgKOH/g, C-7; Butadiene/acrylonitrile/hydroxybutyl methacrylate/methacrylic acid/divinylbenzene=4/3/70/22/1 (% by mol), average particle diameter=65 nm, Tg=76° C., acid value=91 mgKOH/g, hydroxyl value=383 mgKOH/g, C-8; Butadiene/methacrylic acid/hydroxybutyl methacrylate/divinylbenzene=63/10/26/1 (% by mol), average particle diameter=60 nm, Tg=−30° C., acid value=66 mgKOH/g, hydroxyl value=237 mgKOH/g, C-9; Butadiene/methacrylic acid/hydroxybutyl methacrylate/divinylbenzene=77/10/12/1 (% by mol), average particle diameter=60 nm, Tg=−44° C., acid value=97 mgKOH/g, hydroxyl value=179 mgKOH/g, <[D] Crosslinking Agent>

D-1; o-hydroxybenzaldehyde,

D-2; 2,6-bis(hydroxymethyl)-p-cresol,

D-3; Hexamethoxymethylmelamine (trade name "NIKALAC MW-390" manufactured by Sanwa Chemical Co., Ltd.),

[E] Oxirane Ring Containing Compound>

E-1; Cresol novolac-type epoxy resin (trade name "EOCN-4600" manufactured by Nippon Kayaku Co., Ltd.), E-2; Phenol-dicyclopentadiene type epoxy resin (trade name "XD-1000" manufactured by Nippon Kayaku Co., Ltd.), E-3; Bisphenol A-type epoxy resin (trade name "EPICOAT 828" manufactured by Japan Epoxy Resins Co., Ltd.), E-4; Trimethyrol propane polyglycidyl ether (trade name "EPOLIGHT 100MF" manufactured by Kyoeisha Chemical Co., Ltd.), E-5; Novolac-type epoxy resin (trade name "EP-152" manufactured by Japan Epoxy Resins Co., Ltd.), <[F] Adhesion Aid>

F-1; γ-glycidoxypropyl trimethoxysilane (trade name: "A-187" manufactured by Nippon Unicar Co., Ltd.), F-2; 1,3,5-N-tris(trimethoxysilylpropyl)isocyanurate (trade name "Y-11597" manufactured by GE Toshiba Silicones Co., Ltd.), <[G] Solvent>
G-1; Ethyl lactate,
G-2; 2-heptanone,
<[H] Other Additives>
H-1; FTX-218 (manufactured by NEOS COMPANY LIMITED),
H-2; SH8400 (manufactured by Dow Corning Toray Co., Ltd.).

[1-2] Evaluation of Positive-Type Photosensitive Insulation Resin Composition

Characteristics of each positive-type photosensitive insulation resin composition in the above-mentioned Examples 1 to 10 and Comparative Examples 1 to 6 were evaluated according to the following method. The results are shown in Table 2.

(1) Resolution

A 6-inch silicon wafer was spin-coated with a positive-type photosensitive insulating resin composition and heated at 110° C. for 3 minutes on a hot plate to obtain a uniform resin film of 20 μm in thickness. After that, the resin film was irradiated with ultraviolet light from a high-pressure mercury lamp through a patterned mask so that the exposure dose at a wavelength of 420 nm was kept at 500 mJ/cm$^2$ using an aligner "MA-100" manufactured by Karl Suss. Subsequently, it was heated at 110° C. for 3 minutes on a hot plate (PEB) and then developed by immersing in an aqueous solution containing 2.38% by weight of tetramethyl ammonium hydroxide at 23° C. for 120 seconds. The minimum width of the formed pattern was measured and it was taken as the resolution.

(2) Adhesion

A SiO$_2$-sputtered silicon wafer was coated with a positive-type photosensitive insulating resin composition and heated at 110° C. for 3 minutes on a hot plate to obtain a uniform resin film of 10 μm in thickness. After that, the wafer is heated at 190° C. for 1 hour using a convection oven so as to harden the coated resin and obtain a hardened film. Then, this hardened film was subjected to treatment in a condition at a temperature of 121° C. and a humidity of 100% under a pressure of 2.1 atm for 168 hours with a pressure cooker test machine "EHS-221MD" manufactured by ESPEC Corp. The adhesion of the hardened film was evaluated by the cross-cut test (grid tape method) in accordance with JIS K 5400 before and after the test.

(3) Thermal Shock Resistance

Figure 3:
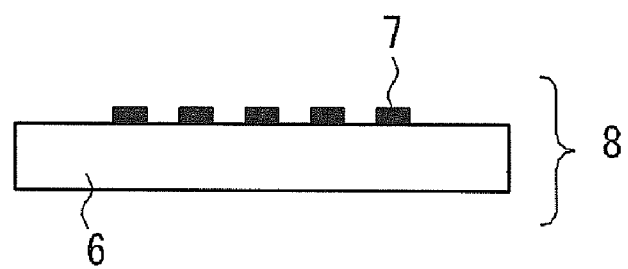
FIG. 3 is a schematic diagram for showing a section of a base material for thermal shock resistance evaluation.

A base material 8 for evaluating thermal shock resistance, which had a copper foil 7 having a specific pattern on a substrate 6 as shown in FIGS. 3 and 4, was coated with a positive-type photosensitive insulating resin composition and heated at 110° C. for 3 minutes on a hot plate to prepare a base material having a resin film of 10 μm in thickness on the copper foil 7. After that, the resin film was heated at 190° C. for 1 hour in a convection oven to harden the resin film to a hardened film. This base material was subjected to a tolerance test at −65° C./30 minutes to 150° C./30 minutes as 1 cycle using a thermal shock test machine "TSA-40L" manufactured by ESPEC Corp. And the number of cycles till a defect such as a crack was caused on the hardened film (per 100 cycles) was measured.

(4) Insulation

A base material 11 for evaluating electrical insulation property, which had a copper foil 10 having a specific pattern on a substrate 9 as shown in FIG. 5, was coated with a positive-type photosensitive insulating resin composition and heated at 110° C. for 3 minutes on a hot plate to prepare a base material having a resin film of 10 μm in thickness on the copper foil 10. After that, the resin film was heated at 190° C. for 1 hour in a convection oven to harden the resin film to a hardened film. The resultant base material was put into a migration evaluation system "AEI EHS-221MD" manufactured by ESPEC Corp. and subjected to treatment in a condition at a temperature of 121° C. and a humidity of 85% under a pressure of 1.2 atm at an applied voltage of 5 V for 200 hours. Then the resistance (Ω) of the hardened film of the test base material was measured to thereby evaluate the insulation.

(5) Patterning Performance

The positive-type photosensitive insulating resin composition was spin-coated on a 6-inch silicon wafer and heated at 110° C. for 5 minutes using a hot plate so as to manufacture a uniform resin film of 20 μm in thickness. After that, the film was exposed to an ultraviolet ray from a high-pressure mercury lamp using an aligner "MA-100" manufactured by Suss Microtec through a mask on which a large number of through patterned squares with 5 μm per side were arranged so that an exposed amount was 8,000 J/m$^2$ at the wavelength of 350 nm. Then, immersion and development were performed in a 2.38% by weight of tetramethyl ammonium hydroxide aqueous solution at 23° C. for 180 seconds. After that, the wafer was washed for 60 seconds with super pure water and dried by air. The surface of the square (5 μm×5 μm) through patterns obtained as above was observed at 1500-fold magnification using a scanning electron microscope "S4200" manufactured by Hitachi Ltd. Evaluation was based on the following criteria:

O; Good (there was no residue deriving from crosslinked resin particle),

X; No good (there was a residue deriving from crosslinked resin particle).

(6) Elongation (Tensile Test)

The positive-type photosensitive insulating resin composition was applied on a PET film and heated at 110° C. for 10 minutes using a convection oven. After that, the resin film was heated at 190° C. for 1 hour and was separated from the PET film so as to obtain a hardened film of 50 μm in thickness. This hardened film was punched by a dumbbell with a width of 5 mm so as to manufacture a test piece. And elongation of the test piece was measured according to JIS K7113 (Testing method for tensile properties of plastics) using a thermomechanical analyzer "TMA/SS6100" manufactured by Seico Instruments Inc.

TABLE 2

| | Resolution (μm) | Adhesion Before test | Adhesion After test | Thermal shock resistance (cycle) | Insulation (Ω) | Patterning performance | Elongation (%) |
|---|---|---|---|---|---|---|---|
| Example 1 | 5 | 100/100 | 100/100 | 2,000 | $1 \times 10^{12}$ | O | 15 |
| Example 2 | 5 | 100/100 | 100/100 | 2,000 | $1 \times 10^{12}$ | O | 20 |
| Example 3 | 10 | 100/100 | 100/100 | 2,200 | $1 \times 10^{12}$ | O | 30 |
| Example 4 | 5 | 100/100 | 100/100 | 2,200 | $1 \times 10^{12}$ | O | 15 |

TABLE 2-continued

|   | Resolution (μm) | Adhesion Before test | Adhesion After test | Thermal shock resistance (cycle) | Insulation (Ω) | Patterning performance | Elongation (%) |
|---|---|---|---|---|---|---|---|
| Example 5 | 5 | 100/100 | 100/100 | 2,200 | $1 \times 10^{12}$ | ○ | 20 |
| Example 6 | 5 | 100/100 | 100/100 | 2,200 | $1 \times 10^{12}$ | ○ | 20 |
| Example 7 | 10 | 100/100 | 100/100 | 2,200 | $1 \times 10^{12}$ | ○ | 30 |
| Example 8 | 10 | 100/100 | 100/100 | 2,200 | $1 \times 10^{12}$ | ○ | 30 |
| Example 9 | 5 | 100/100 | 100/100 | 2,000 | $1 \times 10^{12}$ | ○ | 20 |
| Example 10 | 5 | 100/100 | 100/100 | 2,000 | $1 \times 10^{12}$ | ○ | 20 |
| Comparative Example 1 | 5 | 100/100 | 100/100 | 800 | $1 \times 10^{12}$ | ○ | 5 |
| Comparative Example 2 | 5 | 100/100 | 100/100 | 1,000 | $1 \times 10^{12}$ | ○ | 5 |
| Comparative Example 3 | 5 | 100/100 | 100/100 | 1,000 | $1 \times 10^{12}$ | ○ | 5 |
| Comparative Example 4 | 5 | 100/100 | 100/100 | 1,000 | $1 \times 10^{12}$ | ○ | 5 |
| Comparative Example 5 | 20 | 100/100 | 100/100 | 2,200 | $1 \times 10^{12}$ | X | 20 |
| Comparative Example 6 | 10 | 100/100 | 100/100 | 1,500 | $1 \times 10^{12}$ | ○ | 7 |

[1-3] Preparation of Negative-Type Photosensitive Insulation Resin Composition

Example 11

As shown in Table 3, 100 parts by weight of [I] alkali-soluble resin (I-1), 15 parts by weight of [J] crosslinking agent (J-1), 1 part by weight of [K] acid generator (K-1), 5 parts by weight of [L] crosslinked resin particle (L-1), and 2.5 parts by weight of [N] adhesion aid (N-1) were solved in 145 parts by weight of [O] solvent (O-1) to prepare a negative-type photosensitive insulating resin composition.

Examples 12 to 18 and Comparative Examples 7 to 11

As shown in Table 3, [I] alkali-soluble resin, [J] crosslinking agent, [K] acid generator, [L] crosslinked resin particle, [M] oxirane ring containing compound, [N] adhesion aid, and [P] other additives are solved in [O] solvent in the same manner as in Example 11 to prepare each negative-type photosensitive insulating resin composition.

TABLE 3

|  | (I) Alkali-soluble resin (type/parts) | (J) Crosslinking agent (type/parts) | (K) acid generator (type/parts) | (L) Crosslinked resin particle (type/parts) | (M) Oxirane ring containing compound (type/parts) | (N) Adhesion aid (type/parts) | (O) Solvent (type/parts) | (P) Additive (type/parts) |
|---|---|---|---|---|---|---|---|---|
| Example 11 | I-1/100 | J-1/15 | K-1/1 | L-1/5 | — | N-1/2.5 | O-1/145 | — |
| Example 12 | I-3/100 | J-3/15 | K-2/2 | L-2/30 | — | N-2/2.5 | O-1/145 | — |
| Example 13 | I-2/100 | J-2/35 | K-1/1 | L-4/60 | M-1/15 | N-1/2.5 | O-2/145 | — |
| Example 14 | I-4/100 | J-1/15 | K-1/2 | L-5/130 | M-2/20 | N-1/2.5 | O-1/145 | — |
| Example 15 | I-5/100 | J-3/15 | K-2/2 | L-3/180 | M-3/20 | N-2/2.5 | O-2/145 | — |
| Example 16 | I-3/20 I-5/70 I-6/10 | J-3/20 | K-2/1 | L-8/30 | M-4/5 | N-1/2.5 | O-2/145 | P-1/0.1 |
| Example 17 | I-3/20 I-5/70 I-6/10 | J-3/20 | K-2/1 | L-9/30 | M-4/5 | N-1/2.5 | O-2/145 | P-2/0.1 |
| Comparative Example 7 | I-1/100 | J-1/35 | K-1/2 | — | — | N-1/2.5 | O-1/145 | — |
| Comparative Example 8 | I-2/100 | J-2/25 | K-1/2 | — | — | N-1/2.5 | O-1/145 | — |
| Comparative Example 9 | I-4/100 | J-3/20 | K-2/1 | — | M-1/15 | N-1/2.5 | O-2/145 | — |
| Comparative Example 10 | I-5/100 | J-1/30 | K-1/2 | L-6/70 | M-2/20 | N-2/2.5 | O-1/145 | — |
| Comparative Example 11 | I-3/100 | J-3/20 | K-2/2 | L-7/40 | M-3/10 | N-2/2.5 | O-2/145 | — |

The components described in Table 3 are as follows:

<[I] Alkali-Soluble Resin>

I-1; Copolymer of vinyl benzoate/styrene=20/80 (mol ratio), polystyrene converted weight-average molecular weight (Mw)=10,000, I-2; Copolymer of p-hydroxystyrene/styrene=80/20 (mol ratio), Mw=10,000, I-3; Polyhydroxystyrene, Mw=10,000, I-4; Copolymer of p-hydroxystyrene/styrene/hydroxybutyl acrylate=80/10/10 (mol ratio), Mw=10,000, I-5; Cresol novolak resin of m-cresol/p-cresol=60/40 (mol ratio), Mw=6,500, I-6; 4,4'-{1-[5-[2-(4-hydroxyphenyl)-2-propyl]phenyl]ethylidene}bisphenol (low molecular weight phenolic compound), <[J] Crosslinking Agent>

J-1; o-hydroxybenzaldehyde,

J-2; 2,6-bis(hydroxymethyl)-p-cresol,

J-3; Hexamethoxymethylmelamine (trade name "NIKALAC MW-390" manufactured by Sanwa Chemical Co., Ltd.), <[K] Acid Generator>

K-1; 2-[2-(furan-2-yl)ethenyl]-4,6-bis(trichloromethyl)-s-triazine (trade name "TFE-triazine" manufactured by Sanwa Chemical Co., Ltd.), K-2; 2-[2-(5-methylfuran-2-yl)ethenyl]-4,6-bis(trichloromethyl)-s-triazine (trade name "TME-triazine" manufactured by Sanwa Chemical Co., Ltd.), <[L] Crosslinked Resin Particle>

L-1; Butadiene/hydroxybutyl methacrylate/divinylbenzene=65/33/2 (% by mol), average particle diameter=65 nm, Tg=−38° C., hydroxyl value=205 mgKOH/g, L-2; Butadiene/hydroxybutyl methacrylate/methacrylic acid/divinylbenzene=40/42/17/1 (% by mol), average particle diameter=65 nm, Tg=5° C., acid value=91 mgKOH/g, hydroxyl value=318 mgKOH/g, L-3; Butadiene/styrene/hydroxybutyl methacrylate/methacrylic acid/divinylbenzene=60/10/20/9/1 (% by mol), average particle diameter=65 nm, Tg=−25° C., acid value=60 mgKOH/g, hydroxyl value=194 mgKOH/g, L-4; Butadiene/acrylonitrile/hydroxybutyl methacrylate/methacrylic acid/divinylbenzene=50/20/17/12/1 (% by mol), average particle diameter=65 nm, Tg=−6° C., acid value=88 mgKOH/g, hydroxyl value=213 mgKOH/g, L-5; Butadiene/methacrylic acid/divinylbenzene=78/20/2 (% by mol), average particle diameter=65 nm, Tg=−40° C., acid value=180 mgKOH/g, L-6; Butadiene/styrene/hydroxybutyl methacrylate/methacrylic acid/divinylbenzene=63/22/5/8/2 (% by mol), average particle diameter=65 nm, Tg=−27° C., acid value=60 mgKOH/g, hydroxyl value=98 mgKOH/g, L-7; Butadiene/acrylonitrile/hydroxybutyl methacrylate/methacrylic acid/divinylbenzene=4/3/70/22/1 (% by mol), average particle diameter=65 nm, Tg=76° C., acid value=91 mgKOH/g, hydroxyl value=383 mgKOH/g, L-8; Butadiene/methacrylic acid/hydroxybutyl methacrylate/divinylbenzene=63/10/26/1 (% by mol), average particle diameter=60 nm, Tg=−30° C., acid value=66 mgKOH/g, hydroxyl value=237 mgKOH/g, L-9; Butadiene/methacrylic acid/hydroxybutyl methacrylate/divinylbenzene=77/10/12/1 (% by mol), average particle diameter=60 nm, Tg=−44° C., acid value=97 mgKOH/g, hydroxyl value=179 mgKOH/g, <[M] Oxirane Ring Containing Compound>

M-1; Cresol novolac-type epoxy resin (trade name "EOCN-4600" manufactured by Nippon Kayaku Co., Ltd.), M-2; Phenol-dicyclopentadiene type epoxy resin (trade name "XD-1000" manufactured by Nippon Kayaku Co., Ltd.), M-3; Bisphenol A-type epoxy resin (trade name "EPICOAT 828" manufactured by Japan Epoxy Resins Co., Ltd.), M-4; Trimethyrol propane polyglycidyl ether (trade name "EPOLIGHT 100MF" manufactured by Kyoeisha Chemical Co., Ltd.), <[N] Adhesion Aid>

N-1; γ-glycidoxypropyl trimethoxysilane (trade name: "A-187" manufactured by Nippon Unicar Co., Ltd.), N-2; 1,3,5-N-tris(trimethoxysilylpropyl)isocyanurate (trade name "Y-11597" manufactured by GE Toshiba Silicones Co., Ltd.), <[O] Solvent>

O-1; Ethyl lactate,

O-2; 2-heptanone,

<[P] Other Additives>

H-1; FTX-218 (manufactured by NEOS COMPANY LIMITED),

H-2; SH8400 (manufactured by Dow Corning Toray Co., Ltd.).

[1-4] Evaluation of Negative-Type Photosensitive Insulating Resin Composition

Characteristics of each negative-type photosensitive insulating resin composition in the above-mentioned Examples 11 to 18 and Comparative Examples 7 to 11 were evaluated according to the following method. The results are shown in Table 4.

(1) Resolution

A 6-inch silicon wafer was spin-coated with a negative-type photosensitive insulating resin composition and heated at 110° C. for 3 minutes on a hot plate to obtain a uniform resin film of 20 μm in thickness. After that, the resin film was irradiated with ultraviolet light from a high-pressure mercury lamp through a patterned mask so that the exposure dose at a wavelength of 420 nm was kept at 500 mJ/cm$^2$ using an aligner "MA-100" manufactured by Karl Suss. Subsequently, it was heated at 110° C. for 3 minutes on a hot plate (PEB) and then developed by immersing in an aqueous solution containing 2.38% by weight of tetramethyl ammonium hydroxide at 23° C. for 120 seconds. The minimum width of the formed pattern was measured and it was taken as the resolution.

(2) Adhesion

A SiO$_2$-sputtered silicon wafer was coated with a negative-type photosensitive insulating resin composition and heated at 110° C. for 3 minutes on a hot plate to obtain a uniform resin film of 10 μm in thickness. After that, the wafer is heated at 190° C. for 1 hour using a convection oven so as to harden the coated resin and obtain a hardened film. Then, this hardened film was subjected to treatment in a condition at a temperature of 121° C. and a humidity of 100% under a pressure of 2.1 atm for 168 hours with a pressure cooker test machine "EHS-221MD" manufactured by ESPEC Corp. The adhesion of the hardened film was evaluated by the cross-cut test (grid tape method) in accordance with JIS K 5400 before and after the test.

(3) Thermal Shock Resistance

The negative-type photosensitive insulating resin composition is applied on a base material 8 for thermal shock resistance evaluation having a patterned copper foil 7 on a board 6 as shown in FIGS. 3 and 4 and heated at 110° C. for 3 minutes using a hot plate so as to manufacture a base material having resin coating with the thickness of 10 μm on the copper foil 7. After that, the base material is exposed to an ultraviolet ray from a high-pressure mercury lamp through a pattern mask so that an exposed amount is 500 mJ/cm$^2$ at the wavelength of 365 nm using an aligner "MA-100" manufactured by Karl Suss. Then, the base material is heated (PEB) at 110° C. for 3 minutes using a hot plate and heated at 190° C. for 1 hour using a convection oven so as to harden the resin coating and to obtain a hardened film. This base material is subjected to a tolerance test at −65° C./30 minutes to 150° C./30 minutes as 1 cycle using a thermal shock test machine "TSA-40L" manufactured by ESPEC Corp. And the number of cycles till a defect such as a crack and the like is caused on the hardened film (per 100 cycles) is measured.

A base material 8 for evaluating thermal shock resistance, which had a copper foil 7 having a specific pattern on a substrate 6 as shown in FIGS. 3 and 4, was coated with a negative-type photosensitive insulating resin composition and heated at 110° C. for 3 minutes on a hot plate to prepare a base material having a resin film of 10 μm in thickness on the copper foil 7. After that, the resin film was irradiated with ultraviolet light from a high-pressure mercury lamp through a patterned mask so that the exposure dose at a wavelength of 365 nm was kept at 500 mJ/cm$^2$ using an aligner "MA-100" manufactured by Karl Suss. Subsequently, it was heated at 110° C. for 3 minutes on a hot plate (PEB) and heated at 190° C. for 1 hour in a convection oven to harden the resin film to a hardened film. The resultant base material was subjected to a tolerance test at −65° C./30 minutes to 150° C./30 minutes as 1 cycle using a thermal shock test machine "TSA-40L" manufactured by ESPEC Corp. And the number of cycles till a defect such as a crack was caused on the hardened film (per 100 cycles) was measured.

(4) Insulation

A base material 11 for evaluating electrical insulation property, which had a copper foil 10 having a specific pattern on a substrate 9 as shown in FIG. 5, was coated with a negative-type photosensitive insulating resin composition and heated at 110° C. for 3 minutes on a hot plate to prepare a base material having a resin film of 10 μm in thickness on the copper foil 10. After that, the resin film was irradiated with ultraviolet light from a high-pressure mercury lamp through a patterned mask so that the exposure dose at a wavelength of 365 nm was kept at 500 mJ/cm$^2$ using an aligner "MA-100" manufactured by Karl Suss. Subsequently, it was heated at 110° C. for 3 minutes on a hot plate (PEB) and heated at 190° C. for 1 hour in a convection oven to harden the resin film to a hardened film. The resultant base material was put into a migration evaluation system "AEI EHS-221MD" manufactured by ESPEC Corp. and subjected to treatment in a condition at a temperature of 121° C. and a humidity of 85% under a pressure of 1.2 atm at an applied voltage of 5 V for 200 hours. Then the resistance (Ω) of the hardened film of the test base material was measured to thereby evaluate the insulation.

(5) Patterning Performance

The negative-type photosensitive insulating resin composition was spin-coated on a 6-inch silicon wafer and heated at 110° C. for 5 minutes using a hot plate so as to manufacture a uniform resin film of 20 μm in thickness. After that, the film was exposed to an ultraviolet ray from a high-pressure mercury lamp using an aligner "MA-100" manufactured by Suss Microtec through a mask on which a large number of through patterned squares with 5 μm per side were arranged so that an exposed amount was 8,000 J/m$^2$ at the wavelength of 350 nm. Then, immersion and development were performed in a 2.38% by weight of tetramethyl ammonium hydroxide aqueous solution at 23° C. for 180 seconds. After that, the wafer was washed for 60 seconds with super pure water and dried by air. The surface of the square (5 μm×5 μm) through patterns obtained as above was observed at 1500-fold magnification using a scanning electron microscope "S4200" manufactured by Hitachi Ltd. Evaluation was based on the following criteria:

O; Good (there was no residue deriving from crosslinked resin particle),

X; No good (there was a residue deriving from crosslinked resin particle).

(6) Elongation (Tensile Test)

The negative-type photosensitive insulating resin composition was applied on a PET film and heated at 110° C. for 10 minutes using a convection oven. After that, the resin film was irradiated with ultraviolet light from a high-pressure mercury lamp through a patterned mask so that the exposure dose at a wavelength of 365 nm was kept at 1,000 mJ/cm$^2$ using an aligner "MA-100" manufactured by Karl Suss and was heated at 110° C. for 3 minutes on a hot plate (PEB). Subsequently, the resin film was heated at 190° C. for 1 hour and was separated from the PET film so as to obtain a hardened film of 50 μm in thickness. This hardened film was punched by a dumbbell with a width of 5 mm so as to manufacture a test piece. And elongation of the test piece was measured according to JIS K7113 (Testing method for tensile properties of plastics) using a thermomechanical analyzer "TMA/SS6100" manufactured by Seico Instruments Inc.

TABLE 4

| | Resolution (μm) | Adhesion Before test | Adhesion After test | Thermal shock resistance (cycle) | Insulation (Ω) | Patterning performance | Elongation (%) |
|---|---|---|---|---|---|---|---|
| Example 11 | 5 | 100/100 | 100/100 | 2,000 | $1 \times 10^{12}$ | O | 15 |
| Example 12 | 5 | 100/100 | 100/100 | 2,200 | $1 \times 10^{12}$ | O | 20 |
| Example 13 | 5 | 100/100 | 100/100 | 2,200 | $1 \times 10^{12}$ | O | 20 |
| Example 14 | 10 | 100/100 | 100/100 | 2,200 | $1 \times 10^{12}$ | O | 30 |
| Example 15 | 10 | 100/100 | 100/100 | 2,200 | $1 \times 10^{12}$ | O | 40 |
| Example 16 | 10 | 100/100 | 100/100 | 2,200 | $1 \times 10^{12}$ | O | 40 |
| Example 17 | 10 | 100/100 | 100/100 | 2,200 | $1 \times 10^{12}$ | O | 40 |
| Comparative Example 7 | 5 | 100/100 | 100/100 | 1,000 | $1 \times 10^{12}$ | O | 5 |
| Comparative Example 8 | 5 | 100/100 | 100/100 | 1,000 | $1 \times 10^{12}$ | O | 5 |
| Comparative Example 9 | 5 | 100/100 | 100/100 | 1,000 | $1 \times 10^{12}$ | O | 5 |

TABLE 4-continued

|  | Resolution (μm) | Adhesion Before test | Adhesion After test | Thermal shock resistance (cycle) | Insulation (Ω) | Patterning performance | Elongation (%) |
|---|---|---|---|---|---|---|---|
| Comparative Example 10 | 20 | 100/100 | 100/100 | 2,200 | $1 \times 10^{12}$ | X | 30 |
| Comparative Example 11 | 5 | 100/100 | 100/100 | 1,500 | $1 \times 10^{12}$ | ◯ | 7 |

The invention claimed is:

1. A positive-type photosensitive insulation resin composition characterized by comprising an alkali-soluble resin, a compound having a quinone-diazide group, a crosslinked resin particle consisting of a particulate copolymer containing a constituent derived from a monomer having a hydroxyl group and/or a carboxyl group in an amount of 20% to 90% by mol, and a compound having two or more oxirane rings in its molecule.

2. The positive-type photosensitive insulation resin composition according to claim 1, wherein said alkali-soluble resin is an alkali-soluble resin having a phenolic hydroxyl group.

3. The positive-type photosensitive insulation resin composition according claim 1, further comprising a crosslinking agent.

4. The positive-type photosensitive insulation resin composition according to claim 1, wherein said monomer having a hydroxyl group and/or a carboxyl group is at least one compound selected from the group consisting of hydroxyethyl(meth)acrylate, hydroxypropyl(meth)acrylate, hydroxybutyl(meth)acrylate, (meth)acrylic acid, itaconic acid, β-(meth)acryloxyethyl succinate, β-(meth)acryloxyethyl maleate, β-(meth)acryloxyethyl phthalate and β-(meth)acryloxyethyl hexahydrophthalate.

5. The positive-type photosensitive insulation resin composition according to claim 1, wherein said crosslinked resin particle is consisting of a copolymer of said monomer having a hydroxyl group and/or a carboxyl group and a crosslinkable monomer having two or more polymerizable unsaturated groups.

6. The positive-type photosensitive insulation resin composition according to claim 1, wherein average diameter of said crosslinked resin particle is in the range from 50 to 120 nm.

7. A hardened material characterized by being formed by hardening said positive-type photosensitive insulation resin composition according to claim 1.

8. A circuit board characterized by comprising said hardened material according to claim 7 as an interlayer insulation film or a planarized film.

9. A negative-type photosensitive insulation resin composition characterized by comprising an alkali-soluble resin, a crosslinking agent, a photosensitive acid generator, a crosslinked resin particle consisting of a particulate copolymer containing a constituent derived from a monomer having a hydroxyl group and/or a carboxyl group in an amount of 20% to 90% by mol, and a compound having two or more oxirane rings in its molecule.

10. The negative-type photosensitive insulation resin composition according to claim 9, wherein said alkali-soluble resin is an alkali-soluble resin having a phenolic hydroxyl group.

11. The negative-type photosensitive insulation resin composition according to claim 9, wherein said monomer having a hydroxyl group and/or a carboxyl group is at least one compound selected from the group consisting of hydroxyethyl(meth)acrylate, hydroxypropyl(meth)acrylate, hydroxybutyl(meth)acrylate, (meth)acrylic acid, itaconic acid, β-(meth)acryloxyethyl succinate, β-(meth)acryloxyethyl maleate, β-(meth)acryloxyethyl phthalate and β-(meth)acryloxyethyl hexahydrophthalate.

12. The negative-type photosensitive insulation resin composition according to claim 9, wherein said crosslinked resin particle is consisting of a copolymer of said monomer having a hydroxyl group and/or a carboxyl group and a crosslinkable monomer having two or more polymerizable unsaturated groups.

13. The negative-type photosensitive insulation resin composition according to claim 9, wherein average diameter of said crosslinked resin particle is in the range from 50 to 120 nm.

14. A hardened material characterized by being formed by hardening said negative-type photosensitive insulation resin composition according to claim 9.

15. A circuit board characterized by comprising said hardened material according to claim 14 as an interlayer insulation film or a planarized film.

* * * * *